United States Patent [19]
Grunes et al.

[11] Patent Number: 5,678,980
[45] Date of Patent: *Oct. 21, 1997

[54] ROBOT ASSEMBLY

[75] Inventors: Howard Grunes, Santa Cruz; Avi Tepman, Cupertino; Robert Lowrance, Los Gatos, all of Calif.

[73] Assignee: Applied Materials, Inc., Santa Clara, Calif.

[*] Notice: The term of this patent shall not extend beyond the expiration date of Pat. No. 5,447,409.

[21] Appl. No.: 491,448

[22] Filed: Jun. 16, 1995

Related U.S. Application Data

[63] Continuation of Ser. No. 226,101, Apr. 11, 1994, Pat. No. 5,447,409, which is a continuation of Ser. No. 873,422, Apr. 23, 1992, abandoned, which is a continuation-in-part of Ser. No. 644,852, Jan. 22, 1991, Pat. No. 5,227,708, which is a continuation of Ser. No. 424,771, Oct. 20, 1989, abandoned.

[51] Int. Cl.⁶ ............................................. G25T 18/00
[52] U.S. Cl. ..................................... 414/744.6; 901/15
[58] Field of Search ............................ 414/744.5, 744.6, 414/917; 901/15

[56] References Cited

U.S. PATENT DOCUMENTS

| | | |
|---|---|---|
| 2,722,617 | 11/1955 | Cluwen et al. |
| 2,973,107 | 2/1961 | Cherel. |
| 2,993,152 | 7/1961 | Pierce et al. |
| 3,523,204 | 8/1970 | Rand. |
| 3,781,626 | 12/1973 | Kubo et al. |
| 3,799,057 | 3/1974 | Cassel. |
| 3,936,683 | 2/1976 | Walker. |
| 3,954,191 | 5/1976 | Wittkower et al. |
| 4,163,164 | 7/1979 | Pieters. |
| 4,215,330 | 7/1980 | Hartman. |
| 4,341,502 | 7/1982 | Makino. |
| 4,379,598 | 4/1983 | Goldowsky. |
| 4,381,466 | 4/1983 | Laenens. |
| 4,424,473 | 1/1984 | Gorman. |
| 4,443,043 | 4/1984 | Yamaguchi. |
| 4,450,570 | 5/1984 | Weingartner et al. |
| 4,544,317 | 10/1985 | Carter. |
| 4,634,889 | 1/1987 | Foggie et al. |
| 4,648,784 | 3/1987 | Wiedemann et al. |
| 4,648,785 | 3/1987 | Nakagawa ............................ 414/744 |
| 4,651,591 | 3/1987 | Wurst. |
| 4,664,578 | 5/1987 | Kakehi. |
| 4,666,366 | 5/1987 | Davis. |
| 4,712,971 | 12/1987 | Fyler. |
| 4,715,764 | 12/1987 | Hutchinson. |
| 4,730,976 | 3/1988 | Davis et al. |
| 4,767,378 | 8/1988 | Obermann. |
| 4,786,359 | 11/1988 | Stark et al. |
| 4,808,869 | 2/1989 | Kopp. |
| 4,819,167 | 4/1989 | Cheng et al. |
| 4,836,826 | 6/1989 | Carter. |
| 4,841,908 | 6/1989 | Jacobson et al. |
| 4,861,563 | 8/1989 | Shekerjian et al. |

(List continued on next page.)

FOREIGN PATENT DOCUMENTS

| | | |
|---|---|---|
| 0160305 | 6/1984 | European Pat. Off. |
| 0272141 | 6/1988 | European Pat. Off. |
| 0423608 | 10/1990 | European Pat. Off. |
| 0066014 | 12/1992 | European Pat. Off. |
| 2633863 | 7/1988 | France. |
| 9200071 | 4/1993 | Germany. |
| 8809246 | 1/1988 | WIPO. |

OTHER PUBLICATIONS

Joint Development Agreement Between Applied Materials and two unrelated companies, dated May 29, 1991, pp. 1–14.

*Primary Examiner*—Donald W. Underwood
*Attorney, Agent, or Firm*—Kenyon & Kenyon

[57] ABSTRACT

A robot assembly, including a central hub, has two arms arranged for independent rotation about the hub. Two carriers, oriented 180° apart from each other, are coupled to an end of each of the arms. A drive is provided for rotating the arms in opposite directions to extend one or the other of said carriers radially from said central hub, and for rotating the arms in the same direction to effect rotation of the carriers.

12 Claims, 3 Drawing Sheets

U.S. PATENT DOCUMENTS

| | | |
|---|---|---|
| 4,867,629 | 9/1989 | Iwasawa et al. . |
| 4,896,064 | 1/1990 | Taiani . |
| 4,900,997 | 2/1990 | Durand et al. . |
| 4,909,701 | 3/1990 | Hardegen et al. ............... 414/749 |
| 4,920,551 | 4/1990 | Takahashi et al. . |
| 4,923,584 | 5/1990 | Bramhall, Jr. et al. . |
| 4,944,860 | 7/1990 | Bramhall, Jr. et al. . |
| 4,951,601 | 8/1990 | Maydan et al. . |
| 4,952,299 | 8/1990 | Chrisos et al. . |
| 4,962,441 | 10/1990 | Collins . |
| 4,962,726 | 10/1990 | Matsushita et al. . |
| 4,975,586 | 12/1990 | Ray . |
| 5,000,652 | 3/1991 | Christensen et al. . |
| 5,013,949 | 5/1991 | Mabe, Jr. . |
| 5,019,233 | 5/1991 | Blake et al. . |
| 5,046,909 | 9/1991 | Murdoch . |
| 5,058,526 | 10/1991 | Matsushita et al. . |
| 5,083,896 | 1/1992 | Uehara et al. ............... 414/744.5 |
| 5,092,728 | 3/1992 | Crabb et al. . |
| 5,134,640 | 7/1992 | Hirokawa et al. . |
| 5,147,175 | 9/1992 | Tada . |
| 5,151,008 | 9/1992 | Ishida et al. ............... 414/744.5 |
| 5,180,276 | 1/1993 | Hendrickson ............... 414/752 |
| 5,180,955 | 1/1993 | Karidis et al. . |
| 5,204,572 | 4/1993 | Ferreira . |
| 5,204,573 | 4/1993 | Bederson et al. . |
| 5,227,708 | 7/1993 | Lowrance ............... 318/640 |
| 5,270,600 | 12/1993 | Hashimoto . |
| 5,291,112 | 3/1994 | Karidis et al. . |
| 5,293,107 | 3/1994 | Akeel . |
| 5,294,209 | 3/1994 | Naka et al. . |
| 5,297,910 | 3/1994 | Yoshioka et al. . |
| 5,355,066 | 10/1994 | Lowrance . |
| 5,447,409 | 9/1995 | Grunes et al. ............... 414/744.6 |

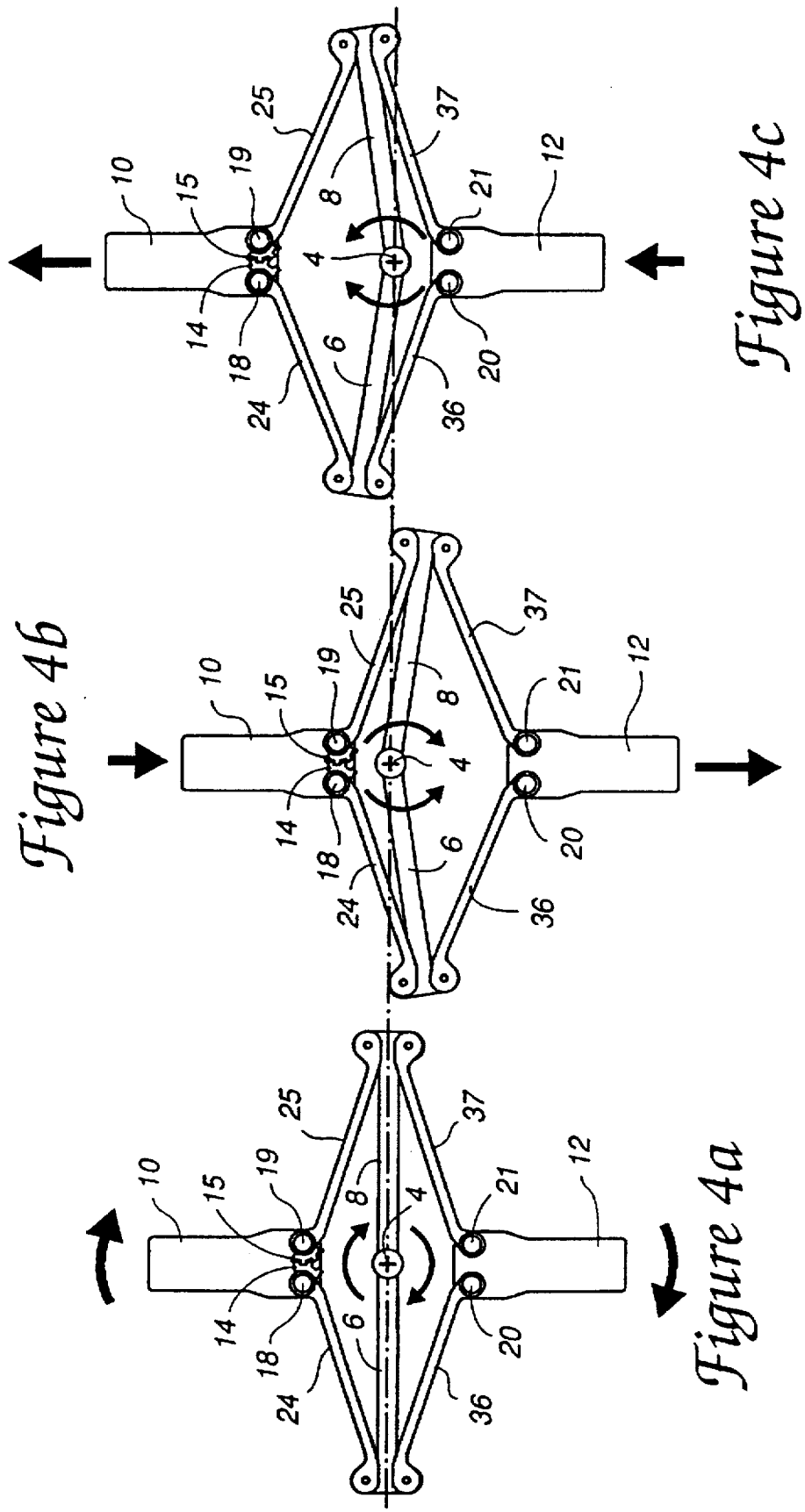

ROBOT ASSEMBLY

This is a continuation of application Ser. No. 226,101, filed Apr. 11, 1994, now U.S. Pat. No. 5,447,409, which is a continuation of application Ser. No. 873,422, filed Apr. 23, 1992, now abandoned, which is a continuation-in-part of application Ser. No. 644,852, filed Jan. 22, 1991, now U.S. Pat. No. 5,227,708, which is a continuation of application Ser. No. 424,771, filed Oct. 20, 1989, now abandoned.

BACKGROUND OF THE INVENTION

1. Technical Field

The present invention relates to robotics. More particularly, the present invention relates to a robot assembly for the simultaneous manipulation of multiple objects, for example semiconductor wafers.

2. Description of the Prior Art

The use of robot arms is a well established manufacturing expedient in applications where human handling is inefficient and/or undesired. For example, in the semiconductor arts robot arms are used to handle wafers during various process steps. Such process steps include those which occur in a reaction chamber, e.g. etching, deposition, passivation, etc., where a sealed environment must be maintained to limit the likelihood of contamination and to ensure that various specific processing conditions are provided.

Current practice includes the use of robot arms to load semiconductor wafers from a loading port into various processing ports within a multiple chamber reaction system. The robot arm is then employed to retrieve the wafer from a particular port after processing within an associated process chamber. The wafer is then shuttled by the robot arm to a next port for additional processing. When all processing within the reaction system is complete, the robot arm returns the semiconductor wafer to the loading port and a next wafer is placed into the system by the robot arm for processing. Typically, a stack of several semiconductor wafers is handled in this manner during each process run.

In multiple chamber reaction systems it is desirable to have more than one semiconductor wafer in process at a time. In this way, the reaction system is used to obtain maximum throughput. In the art, a robot arm used in a reaction system must store one wafer, fetch and place another wafer, and then fetch and place the stored wafer. Although this improves use of the reaction system and provides improved throughput, the robot arm itself must go through significant repetitive motion.

One way to overcome the inefficiency attendant with such wasted motion is to provide a robot arm having the ability to handle two wafers at the same time. Thus, some equipment manufacturers have provided a robot arm in which the two carriers are rotated about a pivot by a motor with a belt drive at the end of the arm. In this way, one wafer may be stored on one carrier while the other carrier is used to fetch and place a second wafer. The carriers are then rotated and the stored wafer may be placed as desired. Such mechanism is rather complex and requires a massive arm assembly to support the weight of a carrier drive located at the end of an extendible robot arm. For example, three drives are usually required for a system incorporating such a robot arm: one drive to rotate the arm, one drive to extend the arm, and one drive to rotate the carriers. Thus, any improvement in throughput as is provided by such a multiple carrier robot arm comes at a price of increased cost of manufacture, increased weight and power consumption, and increased complexity and, thus, reduced reliability and serviceability.

Another approach to providing a multiple carrier robot arm is to place two robot arms coaxially about a common pivot point. Each such robot arm operates independently of the other and improved throughput can be obtained through the increased handling capacity of the system, i.e. two arms are better than one. However, it is not simple to provide two robot arms for independent operation about a common axis. Thus, multiple drives and rigid shafts must be provided, again increasing the cost of manufacture and complexity while reducing reliability.

SUMMARY OF THE INVENTION

The present invention is a robot assembly, including a central hub having two arms. Each arm is arranged for rotation relative to the hub. Two carriers, spaced apart from each other, are provided for handling various objects, such as semiconductor wafers. Each carrier is coupled to an end of each of the arms. A drive is provided for rotating the arms in opposite directions from each other to extend one or the other of the carriers radially from the central hub, and for rotating both arms in the same direction to effect rotation of the carriers about the hub. In the preferred embodiment, one drive is used for rotation of one arm and a second drive is used for rotation of the other arm. By synchronizing drive operation the arms can be rotated in the same or opposite directions.

BRIEF DESCRIPTION OF THE DRAWINGS

FIGS. 4a, 4b, and 4c are schematic representations depicting operation of a robot assembly according to the present invention.

DETAILED DESCRIPTION OF THE INVENTION

Figure 1:
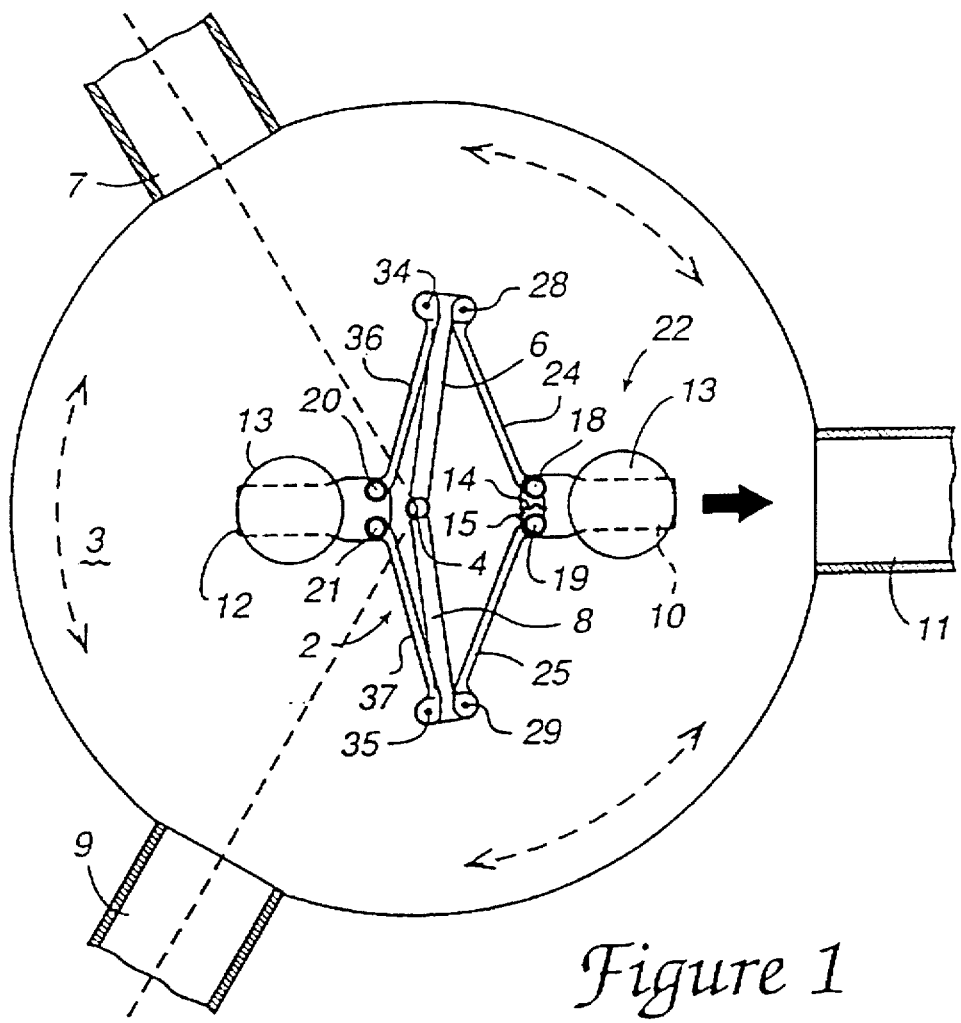
FIG. 1 is a plan view of a robot assembly according to the present invention.

The present invention is best understood by referring to the Drawings in connection with review of this Description. The present invention is a robot assembly adapted to handle multiple objects. In the preferred embodiment, the invention finds application in a reaction system, as is used in the manufacture of semiconductors. For example, the present invention is useful for inserting and withdrawing wafers through a reaction chamber port.

The present invention allows two objects, such as semiconductor wafers, to be handled simultaneously for either insertion, withdrawal, or rotation, such that one wafer may be stored on the robot assembly while the other is placed. This unique feature allows increased throughput during wafer processing when contrasted with prior art robot assemblies which must go through an entire manipulation cycle to effect wafer storage. In this way, the reaction chamber is continuously used to process a wafer, i.e. there is no 'dead-time' while a processed wafer is replaced in the stack and a 'fresh' wafer is fetched, as with prior art systems. The present invention provides similar advantages when used in a daisy-chain type processing arrangement, i.e. multiple reaction chambers used sequentially for a series of processing steps.

In FIG. 1, a robot assembly 2 is shown in plan view in the context of a reaction system 3. The robot assembly 2 is arranged centrally within the reaction system 3 for movement of a semiconductor wafer 13 to and from the reaction chambers 7, 9, and 11. It should be noted that although the exemplary embodiment of the invention discloses a robot assembly centrally located within a reaction system, with the reaction system including three reaction chambers, the present invention is intended for many different applications. Thus, the exemplary embodiment should not be considered limiting the scope of the invention. That is, the present invention is readily adapted for use with any wafer handling application, including reaction systems having any number of reaction chambers and any sort of orientation for the robot assembly.

The robot assembly 2 includes a first arm 6 and a second arm 8 arranged such that one end of each arm is coupled to a central hub 4. Each arm may be rotated independently of the other arm in either a clockwise or a counter-clockwise fashion about hub 4. Thus, the arms may be rotated in both a similar and in an opposite direction. Rotation may be accomplished by any motive source, such as an electrically operated motor or motors.

The motive source should be configured to rotate arm 6 and arm 8 reversibly in either opposing directions or in the same direction. In the preferred embodiment of the invention, the arms are rotatable independently and coaxially about the hub and the motive source is a magnetically coupled motor of the type described in pending U.S. patent application Ser. No. 644,852, filed 22 Jan. 1991, which is a continuation of U.S. patent application Ser. No. 424,771, filed 20 Oct. 1989, now abandoned. Both applications are assigned to Applied Materials, Inc., assignee of the present application.

The arms 6/8 each include a pivot (28 and 29, respectively) provided at an end of the arm opposite the end coupled to hub 4. The arms are pivotally coupled to struts 24/25. The struts, in turn, are coupled by pivots 18/19, to a first wafer carrier 10. Each strut may include a meshing gear 14/15 at an end within the carrier 10 to maintain the carrier 10 in rigid radial alignment with the hub 4 as the struts are pivoted during operation of the robot assembly. In some embodiments of the invention a figure-eight belt may be substituted for the meshing gear 14/15, if desired.

The arms and linkage shown in FIG. 1 form a compound articulated mechanism which is sometimes referred to in the mechanical arts as a frog-leg mechanism. In FIG. 1, the carrier 10 is shown in a partially extended position, for example delivering or retrieving a wafer from a reaction chamber.

A second wafer carrier 12 is also shown in FIG. 1, in which arms 6/8 are joined to struts 36/37 at pivots 34/35 located at one end of the struts. The struts 36/37 are also joined at pivots 20/21, located at the other end of the struts, to the carrier 12. As discussed more fully below, the carrier 12 is linked to the arms 6/8 in an identical manner to that for the carrier 10, such that the two carriers are maintained 180° apart from each other about the axis of the hub 4.

Figure 2:
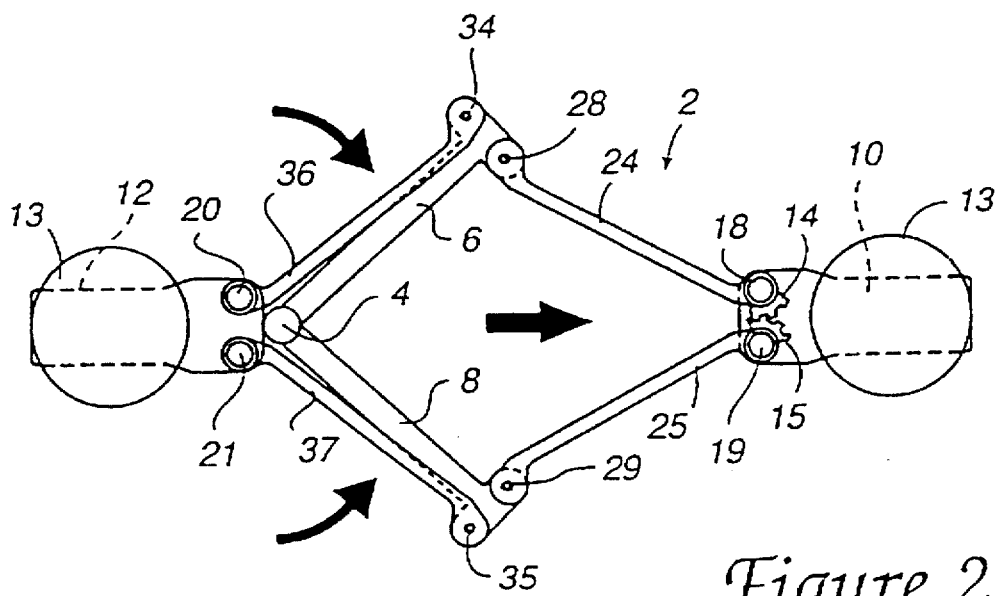
FIG. 2 is a detailed plan view of a robot assembly according to the present invention.

FIG. 2 is a detailed top plan view of robot assembly 2 showing one carrier 10 in a partially extended position and another carrier 12 in a partially retracted position. Arrows in the Fig. show relative motion of arms 6 and 8 about the hub 4. The carrier 10 is coupled to the arms 6/8 by the struts 24/25. The struts 24/25 are configured for rotation in concert with the arms 6/8 by operation of pivots 18/19 at the carrier 10 and pivots 28/29 at the arms 6/8.

The carrier 12 is pivotably coupled to struts 36/37 at pivots 20/21. Struts 36/37 are in turn pivotably coupled to the arms 6/8 at pivots 34/35.

Figure 3:
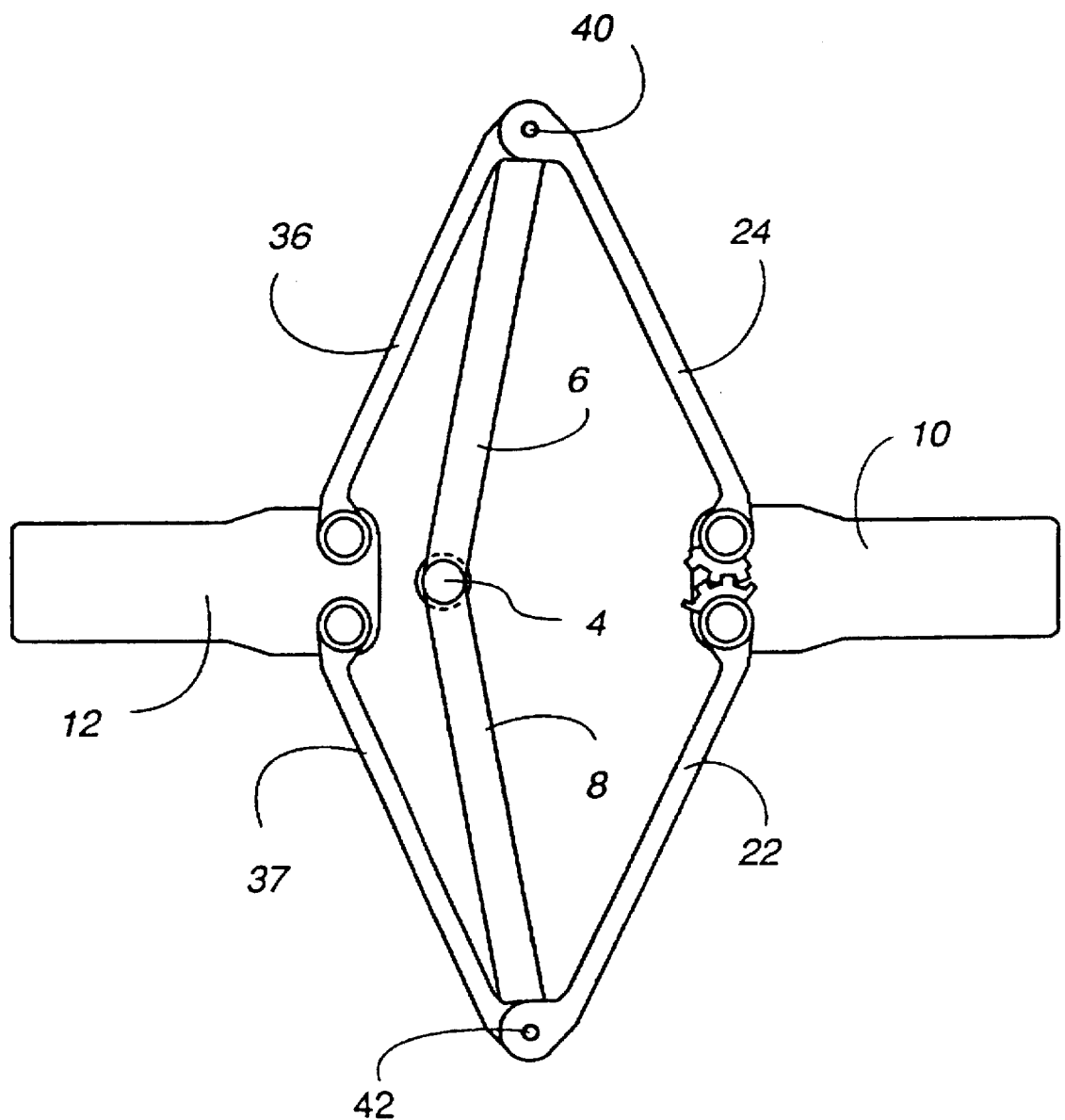
FIG. 3 is a detailed plan view of a portion of a robot assembly according to an alternative embodiment of the invention.

It should be noted that, although the arms 6/8 are each shown having two pivots, one for each carrier/strut, the arms could readily be configured such that the carriers/struts share a single pivot point on each arm. Such arrangement is shown in FIG. 3, in which arms 6/8 are arranged to pivot about the hub 4 at one end of the arms. The other end of each arm includes a single pivot point 40/42, respectively. The arms are coupled at the pivots points 40/42 to two struts each, one strut for each carrier. Thus, the arm 6 is coupled to one strut 24 (for carrier 10) and to another strut 36 (for carrier 12) at pivot 40. While the arm 8 is coupled to one strut 22 (for carrier 10) and to another strut 37 at pivot 42.

Operation of the present invention is shown in FIGS. 4a, 4b, and 4c. In FIG. 4a, the robot assembly 2 is shown undergoing rotational motion of both carriers 10/12 simultaneously about the hub 4, as is indicated by the arrow in the Fig. In preparation for this rotational motion, the arms 6/8 are independently rotated clockwise or counterclockwise about the hub 4 until they are 180° apart, at which point the carriers 10/12 are equidistant from the hub 4. Rotation of the carriers is then effected by rotating both arms 6/8 in the same direction, e.g. clockwise. This rotational force is coupled to the carriers 10/12 through associated struts 24/25 and 36/37.

FIG. 4b shows operation of the robot assembly in which the first carrier 10 is retracted and the second carrier 12 is extended. As is indicated by the arrows, respective counter-clockwise/clockwise motion of the arms 6/8 about the hub 4 exerts a pulling force on the struts 24/25, drawing one carrier 10 toward the hub 4. At the same time, the arms 6/8 exert a pushing force on the struts 36/37 forcing the other carrier 12 away from the hub 4.

FIG. 4c shows operation of the robot assembly in which second carrier 12 is retracted and the first carrier 10 is extended. As is indicated by the arrows, respective clockwise/counter-clockwise motion of the arms 6/8 about the hub 4 exerts a pulling force on the struts 36/37, drawing one carrier 12 toward the hub 4. At the same time, the arms 6/8 exert a pushing force on the struts 24/25 forcing the other carrier 10 away from the hub 4.

The present invention is useful for manipulating multiple objects. As described above, a preferred embodiment of the invention finds application in a reaction system for processing semiconductor wafers. In FIG. 1, a carrier 10 is shown in an extended position, while the other carrier 12 is shown in a retracted position. Thus, one carrier 12 may be used to store a semiconductor wafer, while a carrier 10 is, for example, withdrawing a semiconductor wafer 13 from a reaction chamber 11.

In operation, the robot arm fetches a wafer from a stack of wafers and places the wafer in a reaction chamber. The robot arm then fetches a second wafer while the first wafer remains in the reaction chamber. After sufficient processing time has elapsed, the first wafer is withdrawn from the reaction chamber and the robot arm now carries two wafers, one processed and one fresh. The carriers, when positioned as shown in FIG. 3a, are then rotated, such that a fresh wafer on one carrier is placed into the reaction chamber, while a processed wafer on the other carrier is returned to the stack of wafers. The robot arm then loads another fresh wafer from the stack of wafers and returns to the reaction chamber. The process just described is repeated as required. Additionally, the robot arm of the present invention is readily adapted for use in daisy-chain processes where wafers are moved sequentially through a series of reaction chambers as part of a process flow.

In contrast, prior art robot assemblies require that, for the operation described above, a first wafer is removed from the reaction chamber by the robot assembly and returned to a stack of wafers for storage. The robot assembly is then used to fetch a second wafer and place it in a reaction chamber. During the interval between storage of the first wafer and placing a the second wafer into the reaction chamber, the reaction chamber is idle. This deadtime seriously degrades throughput in the reaction system. The present invention therefore reduces handling and the number of steps involved in moving a wafer within a reaction system and replacing the wafer with a fresh wafer, thus increasing throughput (by eliminating unnecessary and wasted robot assembly motion).

Although the invention is described herein with reference to the preferred embodiment of the robot assembly, one skilled in the art will readily appreciate that applications, other than those involving the handling of semiconductor wafers in a reaction system, and other manipulation schedules, and geometries, etc. may be substituted for those set forth herein without departing from the spirit and scope of the present invention. For example, it is not necessary to have independent coaxial motion of the arms about the hub. Rather, various motions may be provided without departing from the spirit and scope of the invention. Accordingly, the invention should only be limited by the claims included below.

We claim:

1. A robot assembly comprising:
   two independent arms coaxially rotatable about a fixed axis;
   first, second, third and fourth struts, each of the struts having a first end and a second end, wherein the first ends of the first and second struts are coupled to a first end of one of the two independent arms and the first ends of the third and fourth struts are coupled to a first end of the other of the two independent arms;
   first and second carriers, wherein the first carrier is pivotally coupled to the second ends of the first and third struts and the second carrier is pivotally coupled to the second ends of the second and fourth struts, such that the first and second carriers are oriented 180° apart from each other; and
   a drive coupled to a second end of each of said arms to independently move said arms, wherein coaxial movement of said arms about said fixed axis in opposite directions at the same speed extends one or the other of said carriers, and movement of said arms about said axis in the same direction and at the same speed rotates both of said carriers in said same direction.

2. The robot assembly defined in claim 1 further comprising a hub, wherein said arms rotate about the hub, and wherein said carriers are located on opposite sides of said hub.

3. The robot assembly defined in claim 2 further comprising a meshing mechanism interconnecting the first and third struts to maintain the first carrier in a rigid radial alignment.

4. The robot assembly defined in claim 1 wherein the drive comprises at least one magnetic coupler.

5. A robot assembly comprising:
   a hub;
   a pair of carriers;
   first and second linkage mechanisms coupled to one and the other of the pair of carriers respectively and to the hub, wherein the first and second linkage mechanisms comprise first and second arms coaxially and independently moveable about the hub; and
   a drive mechanism coupled to synchronously and independently rotate said first and second arms to cause arcuate movement of the pair of carriers when each of said first and second arms is moved in the same direction about the hub and to cause extension and retraction of each of the pair of carriers respectively when said first and second arms are moved in opposite directions.

6. The robot assembly defined in claim 5 wherein the first and second linkage mechanisms maintain the pair of carriers 180° apart from each other.

7. The robot assembly defined in claim 5 wherein at least one of the first and second linkage mechanisms comprise
   an articulated linkage coupling one of the pair of carriers to the first and second arms; and
   a meshing mechanism coupled to the articulated linkage to maintain said one of the pair of carriers in rigid radial alignment with the hub.

8. The robot assembly defined in claim 7 wherein the meshing mechanism comprises a meshing gear.

9. The robot assembly defined in claim 5 wherein each of the first and second linkage mechanisms comprises a pair of struts, wherein the first and second arms are coupled to distinct struts in each pair of struts by a single pivot.

10. The robot assembly defined in claim 5 wherein the first and second arms are movable about a fixed axis.

11. A robot assembly comprising:
    a hub comprising an axis;
    a first arm coupled coaxially to said hub and movable about the hub;
    a second arm independent of the first arm and coupled coaxially to said hub and movable about the hub;
    two carriers oriented 180° apart from each other;
    a first articulated linkage coupling one carrier to an end of each of said arms;
    a second articulated linkage coupling the other carrier to an end of each of said arms; and
    a drive coupled to the arms to independently move the arms in opposite directions about the hub to extend one of said carriers radially from said hub while drawing the other of said carriers toward the hub, and to move the arms in the same direction to effect arcuate movement of the carriers.

12. The robot assembly defined in claim 11 wherein said first articulated linkage comprises a meshing mechanism that maintains said one carrier in rigid radial alignment with said hub.

* * * * *